United States Patent
Kato et al.

(10) Patent No.: US 8,350,731 B2
(45) Date of Patent: Jan. 8, 2013

(54) COMPLEX-OPERATION INPUT DEVICE

(75) Inventors: Kiyoaki Kato, Miyagi-Ken (JP);
Takashi Uenomachi, Miyagi-Ken (JP);
Shingo Ebinuma, Miyagi-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 261 days.

(21) Appl. No.: 12/820,808

(22) Filed: Jun. 22, 2010

(65) Prior Publication Data
US 2010/0321215 A1    Dec. 23, 2010

(30) Foreign Application Priority Data

Jun. 22, 2009  (JP) ................................ 2009-147766
Jul. 2, 2009   (JP) ................................ 2009-157891

(51) Int. Cl.
    *H03K 17/94*   (2006.01)
(52) U.S. Cl. ...................... 341/35; 250/231.14; 345/184
(58) Field of Classification Search .................... 341/35; 250/231.14; 345/184
    See application file for complete search history.

(56) References Cited

U.S. PATENT DOCUMENTS

| | | | | |
|---|---|---|---|---|
| 3,742,233 A | * | 6/1973 | Gorgens et al. ......... | 250/231.14 |
| 7,538,312 B2 | * | 5/2009 | Tupinier et al. ......... | 250/231.11 |
| 7,978,186 B2 | * | 7/2011 | Vassallo et al. ........... | 345/184 |
| 2008/0079604 A1 | * | 4/2008 | Madonna et al. ......... | 340/825.72 |
| 2008/0264329 A1 | * | 10/2008 | Itoh et al. ........... | 116/311 |
| 2009/0001259 A1 | | 1/2009 | Onodera | |
| 2010/0199212 A1 | * | 8/2010 | Heers et al. ........... | 715/784 |
| 2012/0056761 A1 | * | 3/2012 | Sano ................ | 341/35 |

FOREIGN PATENT DOCUMENTS

JP   2008-16298   1/2008

* cited by examiner

*Primary Examiner* — Patricia Nguyen
(74) *Attorney, Agent, or Firm* — Brinks Hofer Gilson & Lione

(57) ABSTRACT

A complex-operation input device having an operable knob held in a rotatable and slidable manner includes a rotation sensor that detects rotation of the operable knob on the basis of displacement of a second detected portion, and a slide sensor that detects sliding of the operable knob on the basis of displacement of a first detected portion. The direction in which the second detected portion moves with the sliding of the operable knob is substantially orthogonal to a rotation axis about which the operable knob rotates. The slide sensor is disposed such that, when the operable knob is slid, the slide sensor detects the sliding before the rotation sensor detects the displacement of the second detected portion.

4 Claims, 9 Drawing Sheets

COMPLEX-OPERATION INPUT DEVICE

CLAIM OF PRIORITY

This application claims benefit of the Japanese Patent Application No. 2009-147766 filed on Jun. 22, 2009 and Japanese Patent Application No. 2009-157891 filed on Jul. 2, 2009, which are hereby incorporated by reference in their entirety.

BACKGROUND OF THE DISCLOSURE

1. Field of the Disclosure

The present disclosure relates to complex-operation input devices that at least allows for rotating operation and sliding operation.

2. Description of the Related Art

In the related art, a known example of a complex-operation input device of this type has a configuration in which a shaft member is slidably supported by a slide recess in a fixed base, a slide sensor is mounted at the inner bottom of this slide recess. A rotation sensor is mounted on a substrate placed and fixed on the fixed base, and an operable knob is rotatably attached to the shaft member protruding upward from the slide recess in the fixed base (for example, see US Patent No. 2009/0001259 and Japanese Unexamined Patent Application Publication No. 2009-9865). In such a complex-operation input device, when the operable knob is rotated about the shaft member, a change in rotational position of the operable knob is detected by the rotation sensor on the substrate. On the other hand, the shaft member slides integrally with the operable knob, a change in slide position of the shaft member is detected by the slide sensor at the inner bottom of the slide recess.

Furthermore, regarding such a complex-operation input device that allows for sliding operation and rotating operation, a technology for eliminating interference between a plurality of switches to prevent malfunctions has been proposed (for example, see Japanese Unexamined Patent Application Publication No. 2008-16298). Japanese Unexamined Patent Application Publication No. 2008-16298 discloses a complex input device in which, even if a dial knob is rotated when the dial knob is in a slidably operated state, a signal corresponding to rotating operation is not output. Thus, if rotating operation is accidentally performed while sliding operation is being performed, the switches for rotating operation do not electrically function, thereby preventing the occurrence of interference between the switches.

In the complex-operation input device described above, since the plane of rotation of the operable knob rotating in response to rotating operation is parallel to the sliding direction in which the operable knob slides in response to sliding operation, displacement of the operable knob due to the sliding operation can result in a change in the detection state of the rotation sensor that detects rotation of the operable knob, possibly resulting in misdetection.

The technology disclosed in Japanese Unexamined Patent Application Publication No. 2008-16298 is configured to cancel a rotating-operation signal if the dial knob is slidably operated, but does not take into account the fact that the detection state of the rotation sensor undesirably changes prior to detection of the sliding operation.

Furthermore, in the technology disclosed in Japanese Unexamined Patent Application Publication No. 2008-16298, a slide detecting mechanism and a rotation detecting mechanism are connected in series. Therefore, when the dial knob is slidably operated, the rotation detecting mechanism stops electrically functioning, thus causing, for example, the detection state of the rotation sensor previously in an "ON" state to become an "OFF" state and possibly resulting in detection that the dial knob has been rotated. In order to prevent this malfunction, a further countermeasure is necessary.

By providing clicking mechanisms at different rotation angles of the dial knob and adjusting the position at which the dial knob stops at each rotation angle, the position of the rotation sensor, and the shape of a detected portion of the dial knob, a mechanical configuration for preventing the detection state of the rotation sensor from changing in response to sliding operation performed at each clicking position is also possible. However, this configuration has limitations in terms of design and leads to an increase in design load.

In view of the circumstances of the related art described above, the present disclosure provides a complex-operation input device that allows for rotating operation and sliding operation, in which misdetection of rotating operation during sliding operation is prevented, and the design load is reduced.

In the aforementioned complex-operation input device of the related art disclosed in Japanese Unexamined Patent Application Publication No. 2009-9865, although the slide sensor and the rotation sensor are disposed on the same fixed base, the sensors are not necessarily disposed on the same surface on the fixed base. Instead, the former is mounted at the inner bottom of the slide recess in the fixed base, whereas the latter is mounted on the substrate on the fixed base. Therefore, the fixed base requires a reasonable thickness, disadvantageously leading to a hindrance to thickness reduction of the device. In addition, since insert terminals and harnesses for outputting the signals detected by the slide sensor and the rotation sensor to an external circuit are required, the cost of components and the cost of assembly can easily increase.

In view of the circumstances of the related art described above, the present invention provides a complex-operation input device that can readily achieve reduced thickness as well as reduced costs.

SUMMARY

A complex-operation input device includes a rotation detected portion movable integrally with the operable member and provided for detecting rotation of the operable member relative to the base; a slide detected portion movable integrally with the operable member and provided for detecting sliding of the operable member relative to the base; a rotation detecting portion that detects displacement of the rotation detected portion so as to detect the rotation of the operable member; and a slide detecting portion that detects displacement of the slide detected portion so as to detect the sliding of the operable member. A direction in which the rotation detected portion moves in accordance with the sliding of the operable member is substantially orthogonal to a rotation axis about which the rotation detected portion rotates in accordance with the rotation of the operable member. The slide detecting portion is disposed such that, when the operable member slides relative to the base, the slide detecting portion detects movement of the slide detected portion before the rotation detecting portion detects movement of the rotation detected portion.

According to this configuration, when sliding operation is performed, the sliding operation is detected before there is a change in the detection state of the rotation detecting portion. Therefore, rotation detection in that case can be determined to be caused by the sliding operation. Furthermore, in this configuration, a complicated design for an adjustment between clicking positions and sensor positions is not necessary. Consequently, in the complex-operation input device that allows for rotating operation and sliding operation, misdetection of rotating operation during sliding operation is prevented, and the design load is reduced.

The present disclosure also provides a complex-operation input device that allows for rotating operation and sliding operation in a direction substantially orthogonal to a central axis of rotation of the rotating operation. The complex-operation input device includes a first detecting portion and a second detecting portion that are mounted on a base; a slider holder fixed on the base; a holder-slider unit having a rotation guiding portion and a first detected portion, and slidably supported by the slide holder; and a rotor that has a second detected portion extending in a circumferential direction of a cylindrical surface surrounding the holder-slider unit, and that is rotatably supported by the holder-slider unit via the rotation guiding portion. The first detecting portion and the slide holder are disposed within a circle obtained by projecting the cylindrical surface onto the base, and the second detecting portion is disposed on or near the circle. A change in slide position of the first detected portion in response to sliding of the rotor and the holder-slider unit is detected by the first detecting portion, and a change in rotational position of the second detected portion in response to rotation of the rotor is detected by the second detecting portion.

With the complex-operation input device having such a configuration, the first detecting portion provided on the base can detect sliding-operation information (such as the sliding direction) and the second detecting portion provided on the same base can detect rotating-operation information (such as the rotational amount and the rotational direction). Therefore, with the first detecting portion and the second detecting portion disposed on the same surface of the base, the thickness of the entire device can be significantly reduced. Furthermore, since insert terminals and harnesses for outputting signals detected by the first detecting portion and the second detecting portion to an external circuit are not required, cost reduction can be readily achieved. Moreover, since the first detecting portion, the second detecting portion, the slider holder, and the holder-slider unit can all be disposed within a small space with about a size that can be covered by the rotor, compactness of the entire device can be facilitated. In addition, since the second detected portion can be provided on the outermost periphery of the rotor, high accuracy in rotation detection can be readily ensured.

DESCRIPTION OF THE EXEMPLARY EMBODIMENTS

Figure 1:
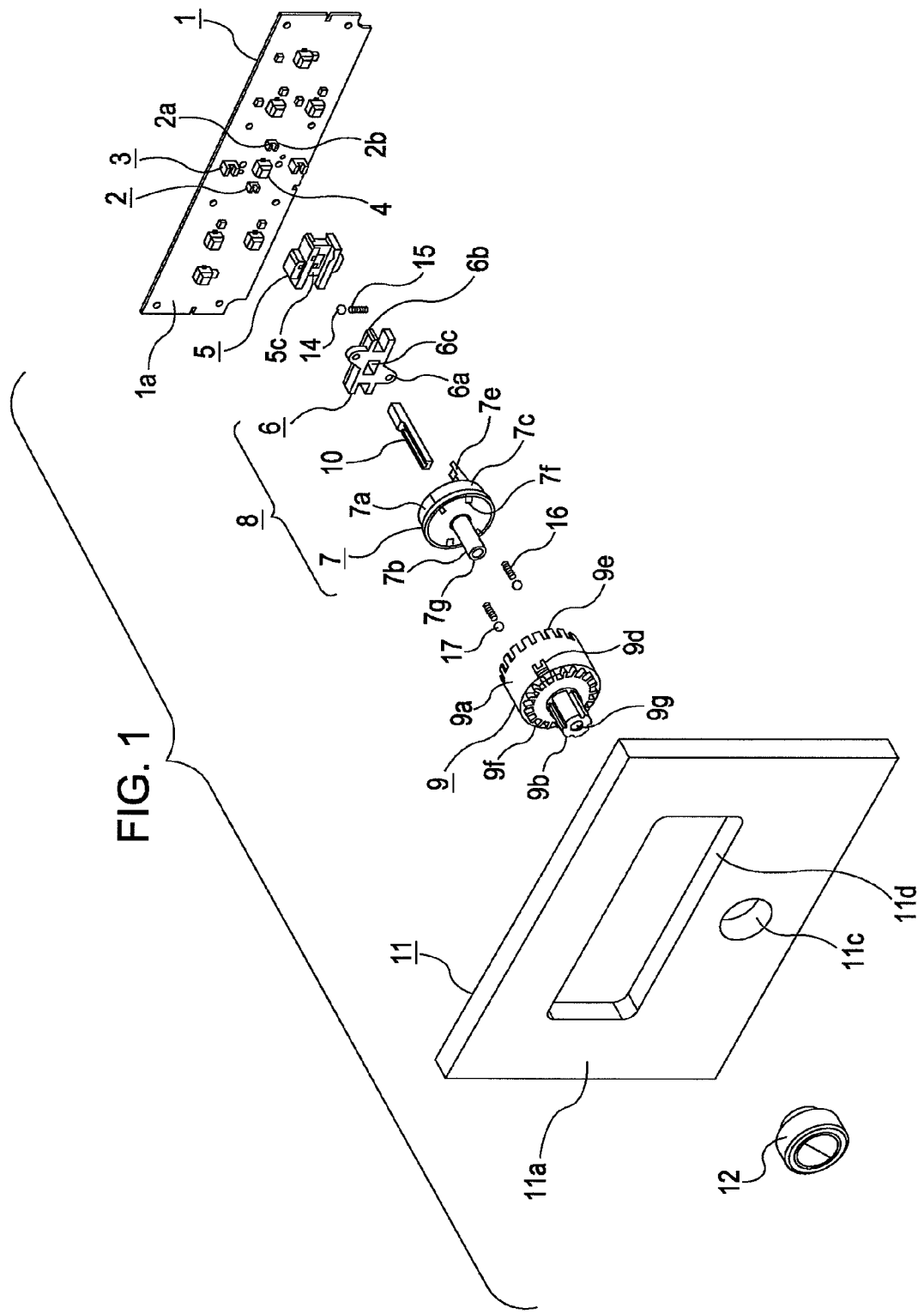
FIG. 1 is an exploded perspective view of a complex-operation input device according to an embodiment of the present invention.

A complex-operation input device according to an embodiment of the present invention will be described below with reference to the drawings. First, the mechanical configuration of the complex-operation input device according to this embodiment will be described with reference to FIGS. 1 to 7. This input device is installed near a driver seat of a vehicle and is used for operating various functions of a vehicle air conditioner. As shown in an exploded perspective view in FIG. 1, the input device mainly includes a substrate (base) 1 on which slide sensors 2, rotation sensors 3, a push switch 4, and the like are disposed, a slider holder 5 fixed on the substrate 1, a holder-slider unit 8 formed by screwing a slider 6 slidably supported by the slider holder 5 onto a rotor holder 7, a rotor 9 rotatably supported by the rotor holder 7, an actuator 10 for pressing and driving the push switch 4, a casing 11 that accommodates these components 1 to 10, and an operable knob 12 spline-fitted to an upper end of the rotor 9 and also snap-fitted thereto in a downwardly movable manner. The operable knob 12 can be rotated, slid, or pressed in a selective manner. In other words, the operable knob 12 is used as an operable member. FIG. 1 does not show the entire casing 11 but only shows a front panel 11*a* thereof.

Figure 2:
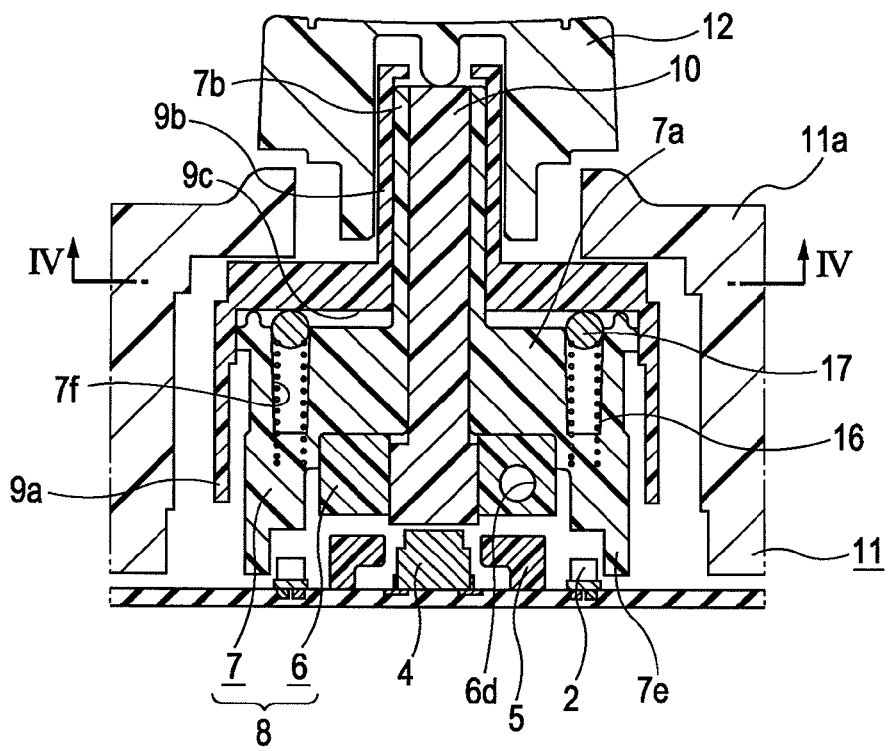
FIG. 2 is a cross-sectional view of the input device, taken along a plane extending in the direction of sliding operation.

An upper surface 1*a* of the substrate 1 is provided with various electronic components including the sensors 2 and 3 and the push switch 4, as well as a wiring pattern (not shown) electrically connected to these electronic components. Each slide sensor 2 is a photo-interrupter having a light emitter 2*a* and a light receiver 2*b* disposed facing each other with a predetermined distance therebetween. The slide sensors 2 forming a pair are disposed at substantially symmetric positions with respect to the push switch 4. Similarly, each rotation sensor 3 is a photo-interrupter having a light emitter 3*a* and a light receiver 3*b* disposed facing each other with a predetermined distance therebetween (see FIG. 3). The rotation sensors 3 forming a pair are disposed at substantially symmetric positions with respect to the push switch 4 and are positioned at a substantially equal distance from the respective slide sensors 2. Specifically, the slide sensors 2 and the rotation sensors 3 are alternately arranged at about a 90° angle from each other around the push switch 4 on the upper surface 1*a* of the substrate 1. However, as shown in FIGS. 2 and 3, the distance from the push switch 4 to each slide sensor 2 is set shorter than the distance from the push switch 4 to each rotation sensor 3.

Figure 3:
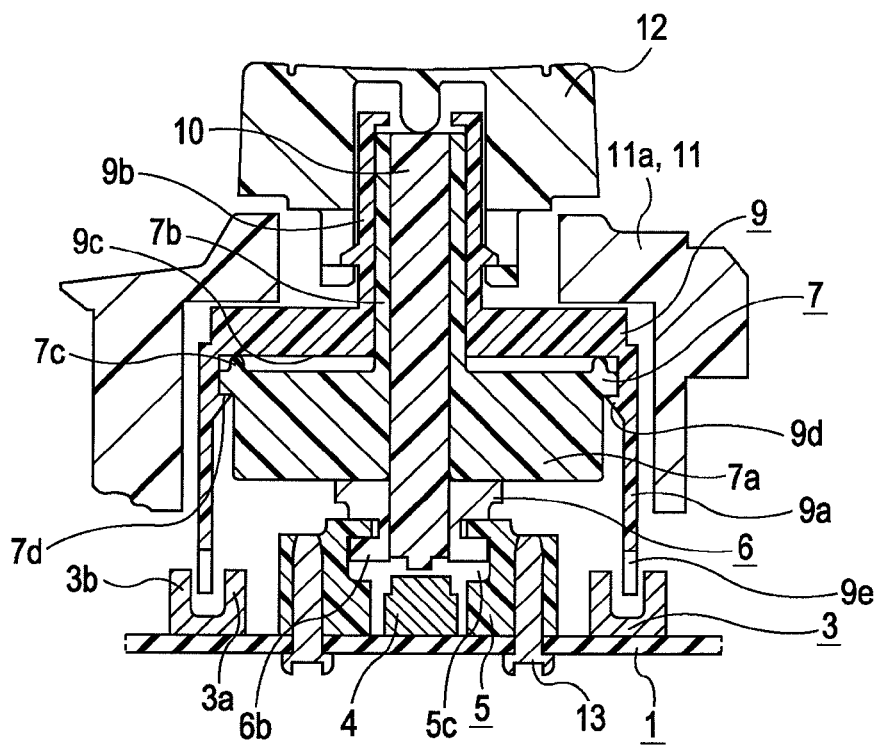
FIG. 3 is a cross-sectional view of the input device, taken along a plane extending orthogonally to the direction of sliding operation.

As shown in FIG. 3, the slider holder 5 is fixed to the substrate 1 with mounting screws 13. The slider holder 5 has positioning pins 5*a* (see FIG. 6) extending into the substrate 1, rail portions 5b slidably engaged with engagement portions 6b of the slider 6, a center recess 5c serving as an accommodation space for the push switch 4 and in which a lower end of the actuator 10 is inserted, and V-shaped cam surfaces 5d (see FIG. 7) with which steel balls 14 are in elastic contact. The steel balls 14 are constantly in elastic contact with the cam surfaces 5d due to a bias force of a first coil spring 15. The steel balls 14 are interposed between the pair of opposing cam surfaces 5d of the slider holder 5 and the opposite ends of the first coil spring 15.

Figure 7:
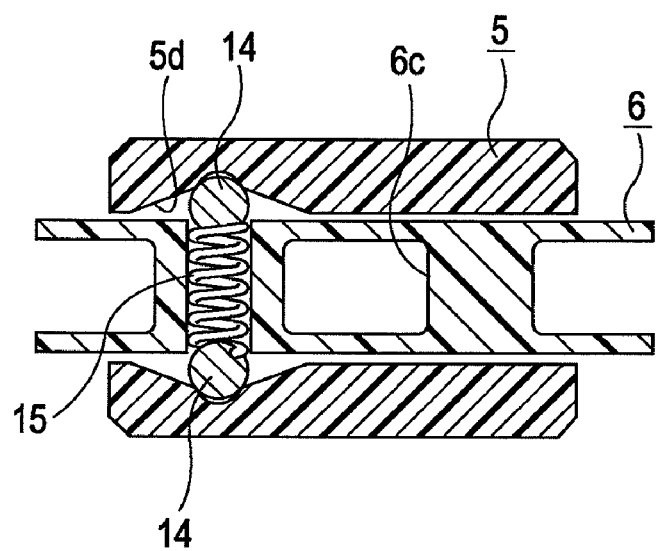
FIG. 7 is a cross-sectional view taken along line VII-VII in FIG. 6.

The slider 6 has mounting portions 6a to which the rotor holder 7 is screwed by using mounting screws 18 (see FIG. 5), the engagement portions 6b slidably engaged with the rail portions 5b of the slider holder 5, a center through-hole 6c through which the actuator 10 extends in a vertically movable manner, and a spring accommodating hole 6d (see FIG. 2) that accommodates the first coil spring 15. The slider 6 is attached to the slider holder 5 by laterally inserting the slider 6 between the two rail portions 5b of the slider holder 5 so as to be slidably supported by the slider holder 5. However, in a state where sliding operation is not performed, since the steel balls 14 are fitted and retained in the V-sections of the corresponding cam surfaces 5d of the slider holder 5, as shown in FIG. 7, the slider 6 is held at a predetermined neutral position with no offset in the sliding direction. During sliding operation, the slider 6 slides along the rail portions 5b so as to cause the steel balls 14 to slide on the slopes of the cam surfaces 5d and thus compress the first coil spring 15. Therefore, when the sliding operation force is released, an elastic recovery force of the first coil spring 15 causes the steel balls 14 to be pushed back into the V-sections of the corresponding cam surfaces 5d. Specifically, the steel balls 14, the first coil spring 15, and the cam surfaces 5d constitute a self-returning mechanism that automatically returns the slider 6 to the original neutral position after the sliding operation.

The rotor holder 7 is formed such that a shaft portion 7b protrudes upward from a large-diameter disk portion 7a, and the bottom of the disk portion 7a is screwed to the slider 6. An upper edge section of the outer peripheral surface of the disk portion 7a serves as a guiding surface 7c that is in slidable contact with the inner wall of the rotor 9. The guiding surface 7c is a cylindrical surface, and the lower edge of the guiding surface 7c is provided with a stepped portion 7d for hooking thereon snap claws 9d of the rotor 9. First detected portions 7e protrude downward respectively from two locations, spaced from each other by 180°, of the outer periphery of the disk portion 7a. The first detected portions 7e are disposed between the engagement portions 6b at both sides of the slider 6 when the slider 6 is in the attached state. Therefore, the engagement portions 6b can be given an increased length, and the bottom surface of the holder-slider unit 8 can be efficiently utilized since the first detected portions 7e are disposed in the space between the engagement portions 6b. When sliding operation is not performed, the first detected portions 7e forming a pair are disposed outside the pair of slide sensors 2, as shown in FIG. 2. On the other hand, when sliding operation is performed, one of the first detected portions 7e, depending on the sliding direction, enters the space between the light emitter 2a and the light receiver 2b of the inner slide sensor 2 so as to block an optical path therebetween, thereby allowing the slide sensor 2 to detect a change in the slide position of the first detected portion 7e. Thus, the direction of the sliding operation can be determined on the basis of this detection result. In other words, the first detected portions 7e function as a slide detected portion, and the slide sensors 2 function as a slide detecting portion. The upper surface of the disk portion 7a is provided with spring accommodating recesses 7f at two locations thereof. Second coil springs 16 accommodated in these spring accommodating recesses 7f elastically bias steel balls 17 toward a roof surface 9c of the rotor 9 (see FIG. 2). The roof surface 9c is provided with a click groove (not shown) having recesses and protrusions arranged continuously in the circumferential direction. Therefore, when the rotor 9 rotates, the steel balls 17 come into and out of engagement with the click groove so as to produce a feeling of "click". The rotor holder 7 is provided with a center through-hole 7g extending through the disk portion 7a and the shaft portion 7b. The actuator 10 extends through this center through-hole 7g in a vertically movable manner.

The rotor 9 has a cylindrical portion 9a and a shaft portion 9b, and is formed to have a shape that covers the rotor holder 7. The rotor 9 is rotatably supported by the rotor holder 7. When assembling the rotor 9 and the rotor holder 7 together, the rotor 9 is fitted over the rotor holder 7 by fitting the cylindrical portion 9a around the disk portion 7a and fitting the shaft portion 9b around the shaft portion 7b so that the rotor 9 and the rotor holder 7 are snap-fitted to each other in a rotatably-connected state. Specifically, the cylindrical portion 9a of the rotor 9 is provided with four inwardly-inclined snap claws 9d arranged at an equal distance from each other in the circumferential direction. As the upper surface of the disk portion 7a fitted in the cylindrical portion 9a approaches the roof surface 9c of the rotor 9, the snap claws 9d become pressed and bent by the guiding surface 7c. Thus, by further pressing the disk portion 7a into the cylindrical portion 9a, the snap claws 9d become hooked onto the stepped portion 7d at the point when the snap claws 9d are past the guiding surface 7c, as shown in FIG. 3, whereby the rotor 9 becomes rotatably connected to the rotor holder 7 in a retained manner. When the rotor 9 is snap-fitted to the rotor holder 7 in this manner, the guiding surface 7c is in slidable contact with an upper edge of the inner wall of the rotor 9, and the steel balls 17 are in elastic contact with the click groove in the roof surface 9c. The slide sensors 2 and the slider holder 5 are disposed within a circle obtained by projecting the cylindrical portion 9a of the rotor 9 onto the substrate 1, and the rotation sensors 3 are disposed at positions aligned with the circle. The rotor 9 is provided with a center through-hole 9g through which substantially the upper half of the actuator 10 extends in a vertically movable manner.

Figure 5:
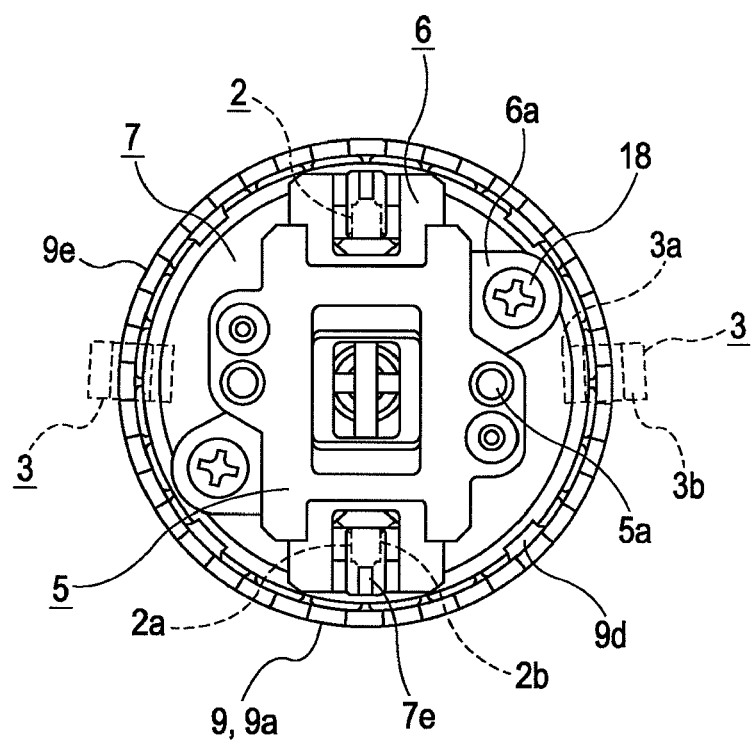
FIG. 5 is a bottom view of the input device without a casing and a substrate thereof.
Figure 6:
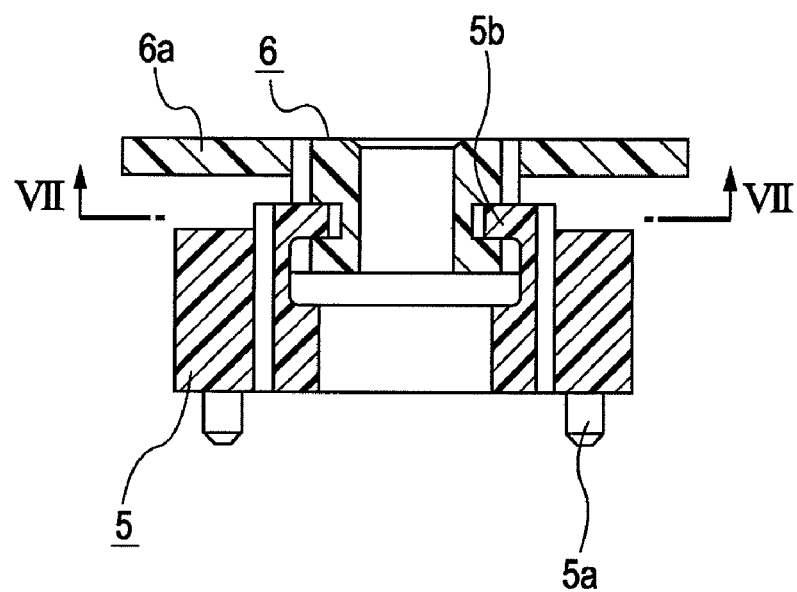
FIG. 6 is a side view showing relevant part of a slider and a slider holder, in an engaged state, of the input device.

A lower edge of the cylindrical portion 9a of the rotor 9 is provided with a comb-like second detected portion 9e extending along the entire circumference. As shown in FIG. 5, when a user sets the operable knob 12 in at least the neutral position in the sliding direction, the slide sensors 2, the slider holder 5, and the holder-slider unit 8 (i.e., the slider 6 and the rotor holder 7) are positioned within the circle obtained by projecting the cylindrical portion 9a onto the upper surface 1a of the substrate 1, and the rotation sensors 3 are positioned at two locations on the circle that are spaced from each other by 180°. As shown in FIG. 3, two sections of the second detected portion 9e that are spaced from each other by 180° are inserted between the light emitters 3a and the light receivers 3b of the pair of rotation sensors 3. Therefore, as the rotor 9 rotates, the second detected portion 9e repeatedly blocks and unblocks the optical paths between the light emitters 3a and the light receivers 3b, whereby a change in the rotational position of the second detected portion 9e can be detected. Thus, the rotational direction and the rotational amount of the rotor 9 can be determined on the basis of the detection results of the pair of rotation sensors 3. Specifically, the second detected portion 9e functions as a rotation detected portion, and the rotation sensors 3 function as a rotation detecting portion.

Figure 4:
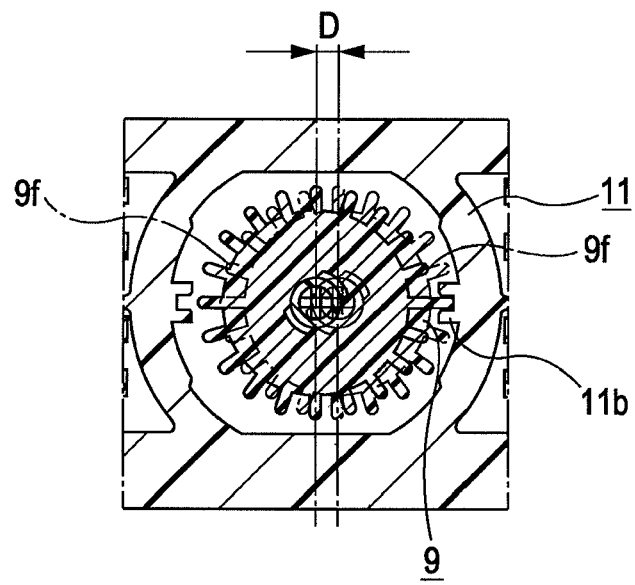
FIG. 4 is a cross-sectional view taken along line IV-IV in FIG. 2.

The upper edge of the cylindrical portion 9a of the rotor 9 is provided with gear-like teeth 9f arranged at an equal pitch along the entire circumference. The teeth 9f are provided for preventing the rotor 9 from rotating during sliding operation. Specifically, when the rotor 9 is slid, one of the teeth 9f always becomes fitted in one of lock grooves 11b provided at two opposing locations in the casing 11, as shown in FIG. 4, so that even if the user tries to perform rotating operation in this state, the rotation of the rotor 9 is inhibited since the tooth 9f is regulated by the casing 11. In FIG. 4, the hatched section indicates the rotor 9 slid rightward by a distance D from the neutral position. Although the steel balls 17 are configured to come into and out of engagement with the click groove when the rotor 9 is rotated, it is not possible to stop the rotor 9 without the steel balls 17 being fitted in any of the recesses arranged at an equal pitch in the click groove. Therefore, by providing the same number of recesses of the rotor 9 and the teeth 9f, one of the teeth 9f is always made to be fitted in one of the lock grooves 11b when sliding operation is performed, regardless of the rotational position of the rotor 9. Since a feeling of "click" is produced by rotating the rotor 9, the user can ascertain the rotational amount of the rotor 9 on the basis of the number of times the "click" is transmitted to the user's hand, without having to look at the operable knob 12.

The front panel 11a of the casing 11 is provided with an opening 11c which is a through-hole that allows the shaft portions 7b and 9b to protrude outward and to slide therein, and a display window 11d in which a liquid-crystal panel (not shown) is fitted. The opening 11c is covered by the operable knob 12, and the opening 11c is not exposed regardless of whether the operable knob 12 is slidably operated. The liquid-crystal display is configured to display a preset temperature and a preset airflow of the vehicle air conditioner.

The inner peripheral surface of the operable knob 12 and the outer peripheral surface of the shaft portion 9b of the rotor 9 are both noncircular and are spline-fitted to each other. The operable knob 12 is provided with a through-hole extending therethrough in the lateral direction, and a projection provided on the shaft portion 9b is snap-fitted thereto so as to be positioned below this through-hole. The operable knob 12 is exposed to the outside, and when the user rotates the operable knob 12, the rotor 9 rotates integrally with the operable knob 12. On the other hand, when the user presses the operable knob 12, the rotor 9 is not pressed but the actuator 10 is. When the user slides the operable knob 12, the rotor 9 and the holder-slider unit 8 (i.e., the slider 6 and the rotor holder 7) slides integrally with the operable knob 12. The operable knob 12 can be used to switch between a temperature selecting mode, an airflow selecting mode, and an outlet selecting mode, and the switching between these modes is performed by sliding the operable knob 12. When the actuator 10 is pressed via the operable knob 12, the push switch 4 is actuated so as to output a predetermined signal (i.e., a signal for setting the selected content) to a control device of the vehicle air conditioner.

The following describes the operation of the complex-operation input device having the above-described configuration and how the device is operated. When sliding operation is not performed, since the steel balls 14 are fitted and retained in the V-sections of the cam surfaces 5d of the slider holder 5, the slider 6 is held at the neutral position in the sliding direction, as shown in FIGS. 2 and 3, so that the actuator 10 is positioned directly above the push switch 4. When the operable knob 12 is rotated in this state, the rotor 9 rotates integrally therewith and causes the comb-like second detected portion 9e of the rotor 9 to move through between the light emitters 2a and the light receivers 2b of the rotation sensors 3, whereby the rotational direction and the rotational amount of the rotor 9 are detected on the basis of the detection results of the pair of rotation sensors 3. Thus, a signal corresponding to the rotational position of the operable knob 12 can be output to the control device of the vehicle air conditioner in any of the temperature selecting mode, the airflow selecting mode, and the outlet selecting mode. On the other hand, when the operable knob 12 is slid rightward or leftward in FIG. 2, the optical path between the light emitter 2a and the light receiver 2b of one of the two slide sensors 2 becomes blocked so that a signal corresponding to the direction of the sliding operation can be output to the control device of the vehicle air conditioner, thereby allowing for switching of the modes using the operable knob 12.

In the complex-operation input device according to this embodiment, when the operable knob 12 is slidably operated, the rotor 9 and the rotor holder 7 are integrally moved in the left-right direction in FIG. 2 or in the direction orthogonal to the plane of drawing in FIG. 3. Therefore, when the operable knob 12 is slidably operated, the second detected portion 9e and the rotation sensors 3 are prevented from coming positionally close to each other, and the distance between the light emitters 3a and the light receivers 3b in the rotation sensors 3 can be reduced, thereby allowing for a reduced installation area.

On the other hand, even when the operable knob 12 is slidably operated, the second detected portion 9e provided in the rotor 9 still passes through between the light emitters 3a and the light receivers 3b so as to possibly create a state similar to that when the rotation sensors 3 detect rotation. In order to avoid this in this embodiment, a detection signal obtained by the slide sensors 2 is used. Therefore, each component is disposed so that, when the operable knob 12 is slidably operated, the slide sensors 2 detect the displacement of the first detected portions 7e before the rotation sensors 3 detect the displacement of the second detected portion 9e. Detailed descriptions of the function and the operation will be provided below.

For example, when in the temperature selecting mode, after an appropriate preset temperature is selected by rotating the operable knob 12, the operable knob 12 may be pressed so as to actuate the push switch 4, thereby outputting a signal corresponding the selected preset temperature to the control device of the vehicle air conditioner and thus changing the temperature of warm air or cool air to be supplied to the interior of the vehicle. When the operable knob 12 is subsequently slid leftward in FIG. 2, the optical path between the light emitter 2a and the light receiver 2b of the right slide sensor 2 in FIG. 2 becomes blocked, thereby switching from the temperature selecting mode to the airflow selecting mode. When in the airflow selecting mode, after an appropriate preset airflow is selected by rotating the operable knob 12, the operable knob 12 may be pressed, thereby outputting a signal corresponding to the selected preset airflow to the control device of the vehicle air conditioner and thus increasing or decreasing the amount of warm air or cool air to be supplied to the interior of the vehicle. When switching from the airflow selecting mode to the temperature selecting mode, the operable knob 12 may be slid again leftward in FIG. 2.

When in the temperature selecting mode or the airflow selecting mode, if the operable knob 12 is slid rightward in FIG. 2, the optical path between the light emitter 2a and the light receiver 2b of the left slide sensor 2 in FIG. 2 becomes blocked, thereby switching to the outlet selecting mode. When in the outlet selecting mode, after an appropriate outlet is selected by rotating the operable knob 12, the operable knob 12 may be pressed, thereby outputting a signal corresponding to the selected outlet to the control device of the vehicle air conditioner and thus causing warm air or cool air to be supplied to the interior of the vehicle from the selected outlet. When in the outlet selecting mode, if the operable knob 12 is slid rightward in FIG. 2, the mode is switched to the temperature selecting mode, whereas if the operable knob 12 is slid leftward in FIG. 2, the mode is switched to the airflow selecting mode.

As mentioned above, when the sliding operation force is released, the operable knob 12 is automatically returned to the neutral position, and during the sliding operation, one of the teeth 9f is fitted in one of the lock grooves 11b so as to inhibit rotating operation. This prevents the possibility of accidental output of rotating-operation information of an undesired mode. Furthermore, since the liquid-crystal display (not shown) fitted in the display window 11d of the casing 11 is configured to display the current set contents of the vehicle air conditioner and the current mode of the operable knob 12, the user can confirm the operation contents by viewing the liquid-crystal display.

As described above, in the complex-operation input device according to this embodiment, the slide sensors 2 and the rotation sensors 3 are disposed on the same surface of the substrate 1, and the slide sensors 2 can detect the sliding direction during sliding operation, and the rotation sensors 3 can detect the rotational amount and the rotational direction during rotating operation, whereby the entire device can be significantly reduced in thickness. Furthermore, since insert terminals and harnesses for outputting signals detected by the slide sensors 2 and the rotation sensors 3 to an external circuit are not required, cost reduction can be readily achieved. Moreover, since the slide sensors 2, the rotation sensors 3, the slider holder 5, and the holder-slider unit 8 (i.e., the slider 6 and the rotor holder 7) can all be disposed within a small space with about a size that can be covered by the rotor 9, compactness of the entire device can be facilitated. In addition, since the second detected portion 9e can be provided on the outermost periphery of the rotor 9, high accuracy in rotation detection can be readily ensured.

Furthermore, since the slide sensors 2 and the rotation sensors 3 are positioned apart from each other by about 90° around an intersecting point (i.e., the center of the push switch 4 in this embodiment) between the rotation axis of the rotor 9 and the substrate 1 in the above-described complex-operation input device, the installation spaces for the pair of slide sensors 2 and the pair of rotation sensors 3 can be readily ensured on the substrate 1, and the routing of the wiring pattern on the substrate 1 can be facilitated. In addition, since the slide sensors 2 and the rotation sensors 3 are both photo-interrupters, high reliability can be readily maintained over a long period of time, and moreover, interference between the rotation sensors 3 and the rotor 9 (second detected portion 9e) concerned during sliding operation can be readily avoided.

Figure 8:
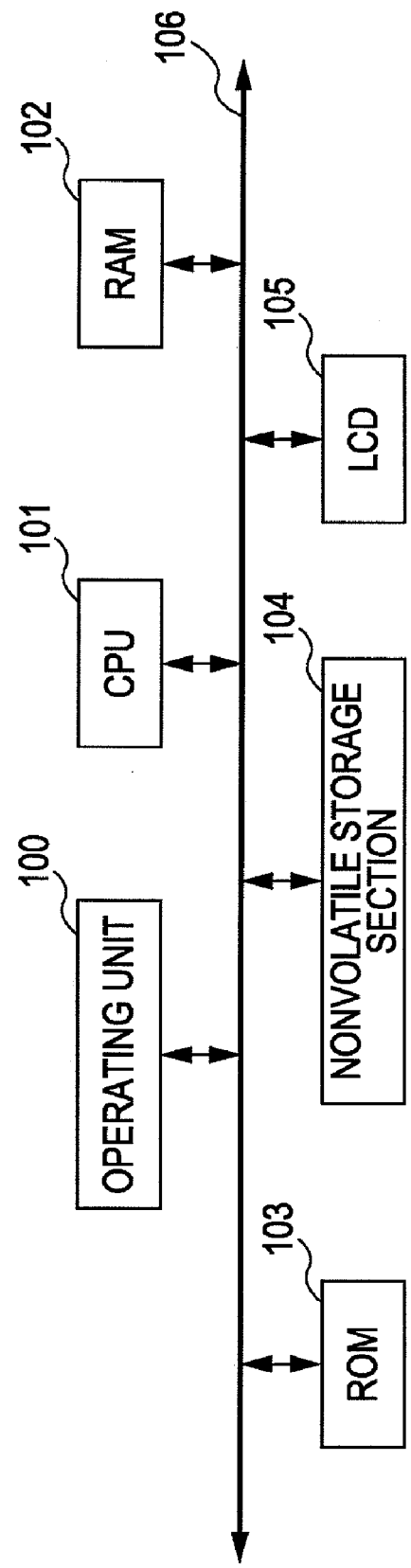
FIG. 8 is a block diagram illustrating a hardware configuration of a control system of the complex-operation input device according to the embodiment of the present invention.

Next, a control system of the input device according to this embodiment will be described with reference to the drawings. FIG. 8 is a block diagram illustrating a hardware configuration of the control system of the input device according to this embodiment. As shown in FIG. 8, the complex-operation input device according to this embodiment has a similar configuration to an information processing terminal, such as a common server or a personal computer (PC), in addition to having an operating unit 100 corresponding to the mechanical components described in FIGS. 1 to 7. Specifically, the complex-operation input device according to this embodiment includes a central processing unit (CPU) 101, a random access memory (RAM) 102, a read-only memory (ROM) 103, a nonvolatile storage section 104, and a liquid-crystal display (LCD) 105 that are connected to each other via a bus 106.

The CPU 101 is an arithmetic unit configured to control the operation of the entire complex-operation input device. The RAM 102 is a volatile storage medium capable of reading and writing information at high speed and is used as a work area when the CPU 101 processes information. The ROM 103 is a read-only nonvolatile storage medium and stores programs, such as firmware.

The nonvolatile storage section 104 is a storage medium, such as a hard disk drive (HDD), a nonvolatile RAM (NVRAM), or an optical disk, and stores an operating system (OS), various control programs, and application programs. The LCD 105 is a visual user interface to be used by the user for confirming the operation state of the complex-operation input device.

In such a hardware configuration, the programs stored in the storage media, such as the ROM 103 and the nonvolatile storage section 104, are read out to the RAM 102 and are executed under the control of the CPU 101, thereby forming a software control unit. With a combination of the software control unit formed in this manner and hardware, such as an integrated circuit, a functional block that achieves the function of the complex-operation input device according to this embodiment is constructed.

Figure 9:
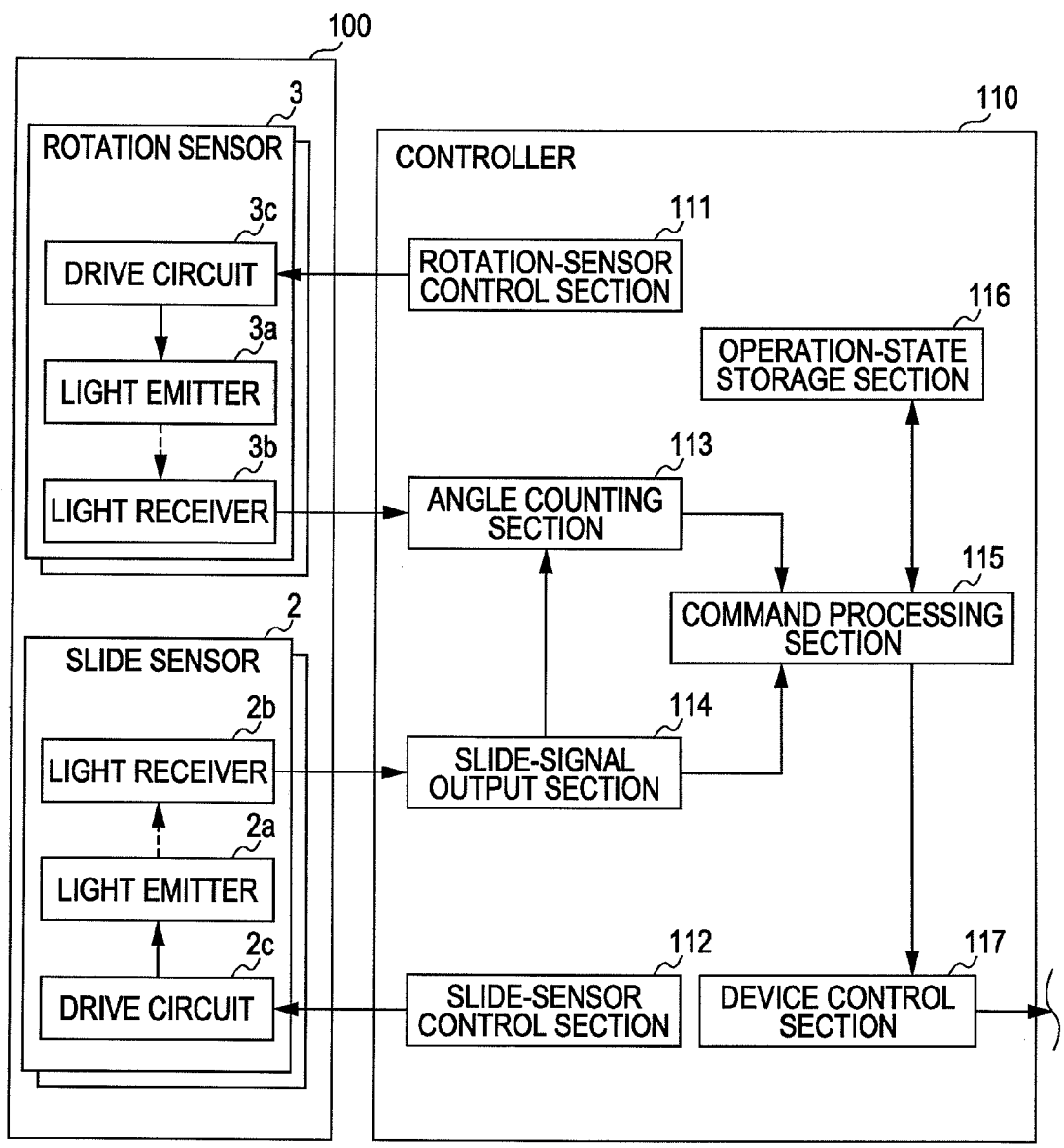
FIG. 9 is a block diagram illustrating a functional configuration of the control system of the complex-operation input device according to the embodiment of the present invention.

Next, a functional configuration of the complex-operation input device according to this embodiment will be described with reference to FIG. 9. FIG. 9 is a block diagram illustrating the functional configuration between the slide sensors 2 and the rotation sensors 3 included in the operating unit 100 and a controller 110 that controls the sensors in the complex-operation input device according to this embodiment. As shown in FIG. 9, in addition to the light emitter 2a and the light receiver 2b, each slide sensor 2 includes a drive circuit 2c that drives the light emitter 2a. Likewise, in addition to the light emitter 3a and the light receiver 3b, each rotation sensor 3 includes a drive circuit 3c that drives the light emitter 3a.

The light receivers 2b and the light receivers 3b are photoelectric elements that respectively receive light emitted from the light emitters 2a and the light emitters 3a and that output electric signals. In this embodiment, when the user slides the operable knob 12, one of the first detected portions 7e blocks between the light emitter 2a and the light receiver 2b of the corresponding slide sensor 2. This causes the light receiver 2b to output an electric signal corresponding to the sliding operation. On the other hand, when the user rotates the operable knob 12, the second detected portion 9e blocks between the light emitters 3a and the light receivers 3b. This causes the light receivers 3b to output an electric signal corresponding to the rotating operation.

The controller 110 includes a rotation-sensor control section 111, a slide-sensor control section 112, an angle counting section 113, a slide-signal output section 114, a command processing section 115, an operation-state storage section 116, and a device control section 117. As mentioned above, the controller 110 is configured such that a program stored in the ROM 103 or the nonvolatile storage section 104 shown in FIG. 8 is loaded to the RAM 102 and is executed under the control of the CPU 101. The controller 110 functions as a signal processor that outputs an operation signal for operating a device in accordance with the detection result of one of the slide sensors 2 or the rotation sensors 3.

The rotation-sensor control section 111 and the slide-sensor control section 112 respectively control the drive circuit 3c of each rotation sensor 3 and the drive circuit 2c of each slide sensor 2 so as to drive the rotation sensor 3 and the slide sensor 2. The angle counting section 113 counts the rotational angle of the operable knob 12 in accordance with an output signal from the light receiver 3b of the rotation sensor 3 and outputs the count result. In other words, the angle counting section 113 functions as a rotation-signal output section. The slide-signal output section 114 recognizes sliding of the operable knob 12 in accordance with an output signal from the light receiver 2b of the slide sensor 2 and outputs a signal indicating that the operable knob 12 is slid. The output signals from the angle counting section 113 and the slide-signal output section 114 are input to the command processing section 115. The output signal from the slide-signal output section 114 is also input to the angle counting section 113.

Figure 10:
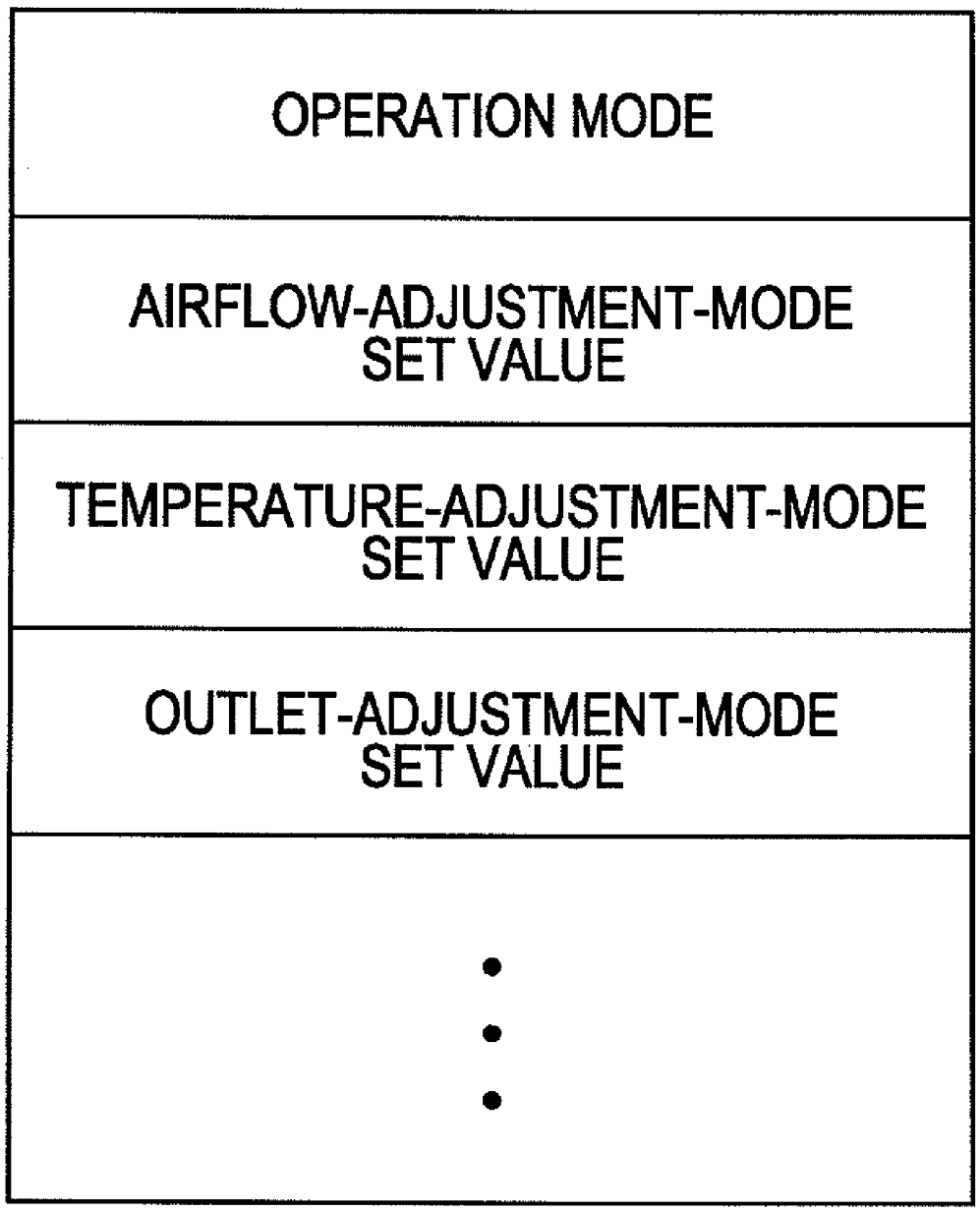
FIG. 10 illustrates an example of operation-state information stored in an operation-state storage section of the complex-operation input device according to the embodiment of the present invention.

The operation-state storage section 116 is a storage section that holds information related to the operation states of various devices. FIG. 10 illustrates examples of information stored in the operation-state storage section 116. As shown in FIG. 10, the operation-state storage section 116 stores information related to an "operation mode", an "airflow-adjustment-mode set value", a "temperature-adjustment-mode set value", and an "outlet-adjustment-mode set value".

Information related to the "operation mode" indicates an item of a subject to be controlled by the complex-operation input device. The complex-operation input device according to this embodiment has three modes, which are an "airflow adjustment mode", a "temperature adjustment mode", and an "outlet adjustment mode" for adjusting the airflow, the temperature, and the outlet, respectively, of the vehicle air conditioner. Information related to the "airflow-adjustment-mode set value" indicates a set value, that is, a set airflow value, corresponding to when the complex-operation input device operates under the "airflow adjustment mode".

Information related to the "temperature-adjustment-mode set value" indicates a set value, that is, a set temperature value, corresponding to when the complex-operation input device operates under the "temperature adjustment mode". Information related to the "outlet-adjustment-mode set value" indicates a set value, that is, a set outlet value, corresponding to when the complex-operation input device operates under the "outlet adjustment mode". Since the set values corresponding to the respective modes are stored in the operation-state storage section 116 in this manner, multiple modes can be used in a switching manner.

When the output signal is received from the angle counting section 113, the command processing section 115 acquires and refers to the information from the operation-state storage section 116 so as to confirm the operation mode. Then, the command processing section 115 refers to a set value corresponding to the current operation mode and calculates an updated set value in accordance with the rotational angle received from the angle counting section 113. After calculating the updated set value, the command processing section 115 writes the updated set value over the operation-state storage section 116, and sends the updated set value to the device control section 117 so as to actually control the devices.

The device control section 117 actually controls the devices in accordance with the information received from the command processing section 115. In this embodiment, the device control section 117 controls the devices corresponding to the aforementioned "airflow adjustment mode", "temperature adjustment mode" and "outlet adjustment mode". In such a functional configuration, the main point of this embodiment is that detection of rotating operation by the angle counting section 113 is invalidated when the slide-signal output section 114 outputs a slide signal. The operation of the complex-operation input device according to this embodiment will be described below.

Figure 11:
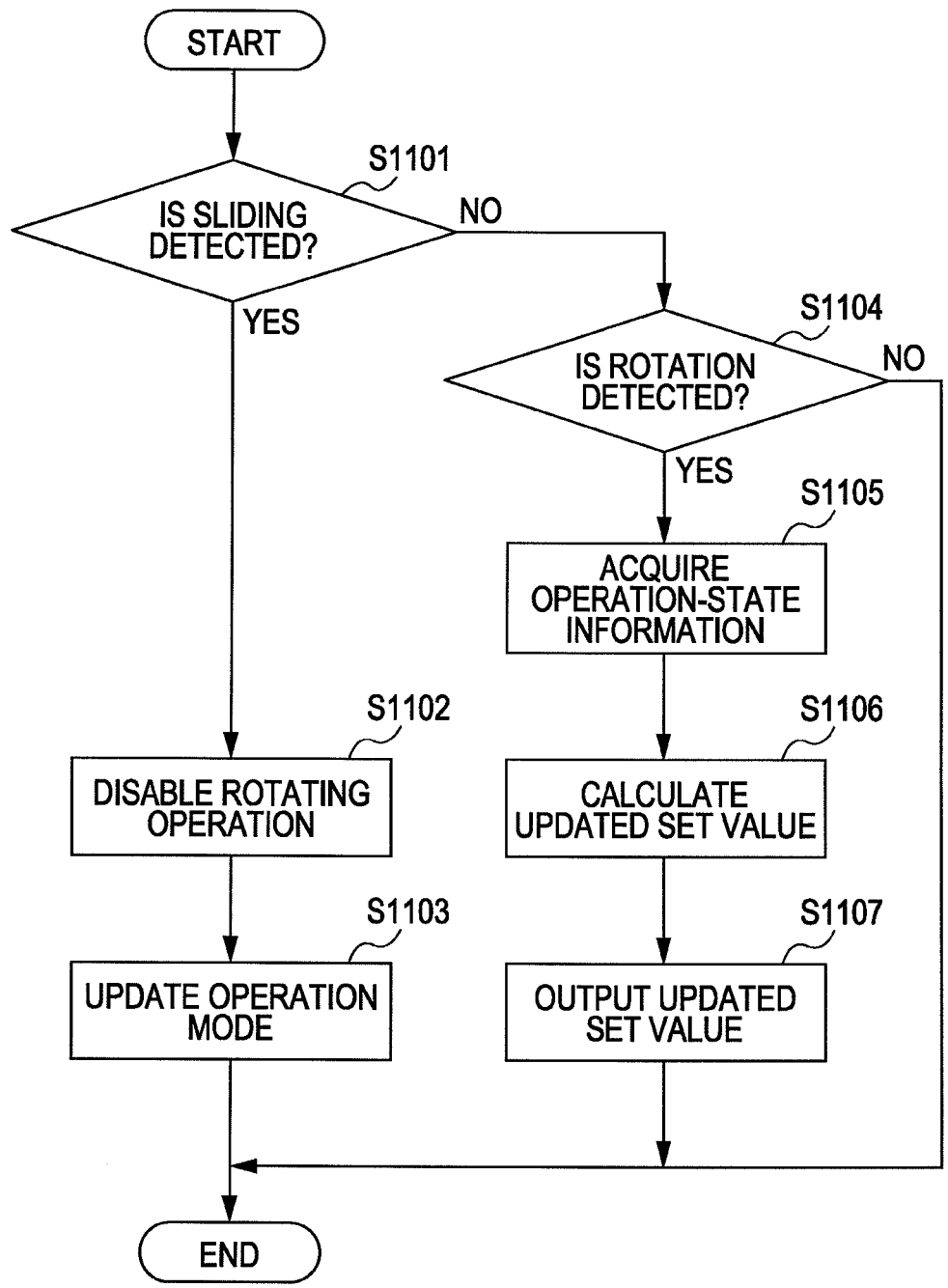
FIG. 11 is a flow chart illustrating the operation of the control system of the complex-operation input device according to the embodiment of the present invention.

FIG. 11 is a flow chart illustrating the operation of the control system of the complex-operation input device according to this embodiment. As shown in FIG. 11, when the slide-signal output section 114 recognizes sliding on the basis of an output signal from the light receiver 2b of one of the slide sensors 2 (YES in step S1101), the slide-signal output section 114 outputs a slide signal to the command processing section 115 and the angle counting section 113, as mentioned above. As a result, the angle counting section 113 disables rotating operation of the operable knob 12 performed by the user in step 1102.

Figure 12:
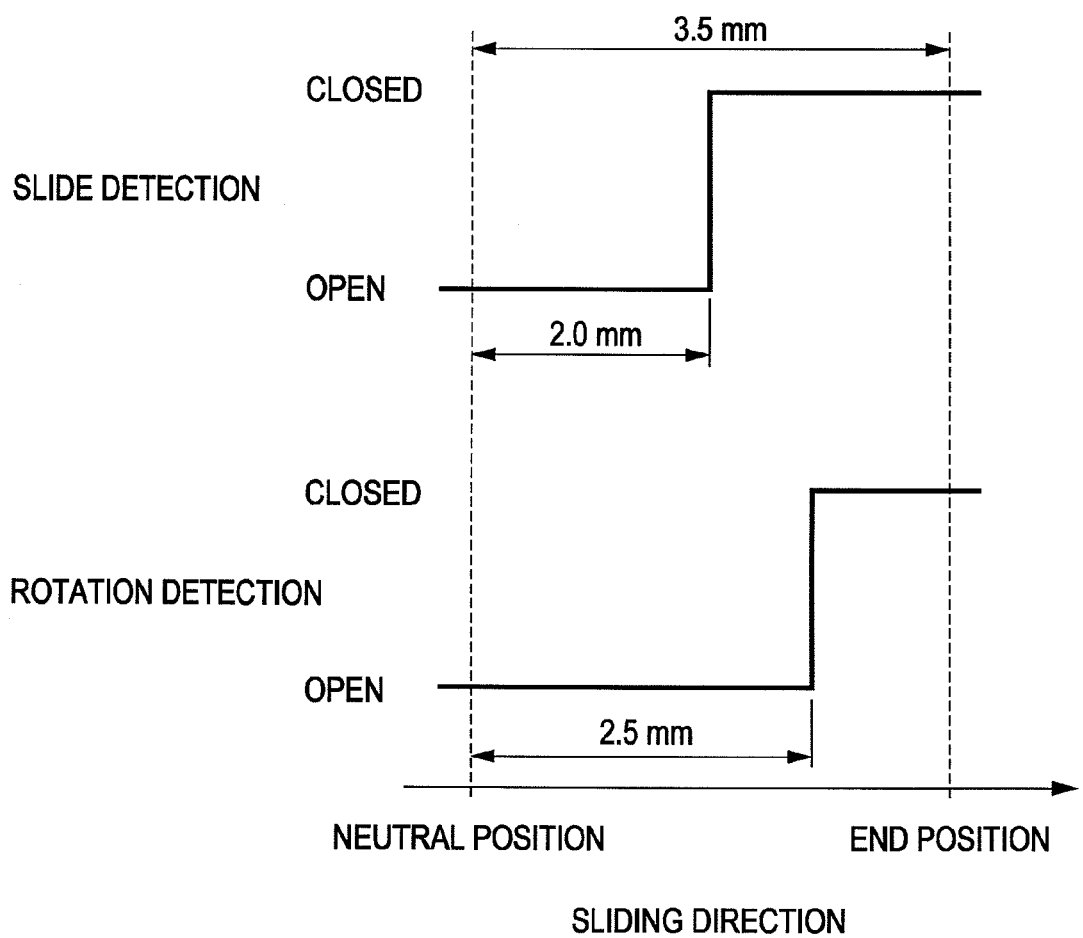
FIG. 12 is a timing chart illustrating a detection state of a slide sensor and a detection state of an angle counting section in accordance with sliding operation of an operable knob.

Thus, the angle counting section 113 maintains the signal output state to the command processing section 115, regardless of whether an output signal is output from the rotation sensors 3. Specifically, the angle counting section 113 maintains the signal output state to the command processing section 115 in accordance with a slide detection signal. Therefore, even if the light reception state of the light receivers 3b of the rotation sensors 3 changes due to sliding operation of the operable knob 12 and the signal output state from the light receivers 3b changes accordingly, the output signal from the angle counting section 113 does not change. FIG. 12 illustrates an example of a detection state of the light receiver 2b of each slide sensor 2 and a detection state of the light receiver 3b of each rotation sensor 3 when the operable knob 12 is slidably operated by the user.

FIG. 12 schematically illustrates the detection state of the light receiver 2b and the light receiver 3b when the operable knob 12 is slidably operated. In FIG. 12, the term "CLOSED" indicates a state where rotation or sliding is detected, the term "OPEN" indicates a non-detected state, and the abscissa indicates an amount of displacement of the operable knob 12 from the neutral position (reference position).

As shown in FIG. 12, when the operable knob 12 is slidably operated, the operable knob 12 starts moving from the neutral position. At the point when the operable knob 12 is displaced by 2.0 mm, the slide detection reaches the "CLOSED" state. While the slide detection is in the "CLOSED" state in this manner, that is, while the optical path between the light emitter 2a and the light receiver 2b of one of the slide sensors 2 is blocked by the corresponding first detected portion 7e, the output signal from the angle counting section 113 is fixed and does not change. Thus, rotating operation is disabled, as mentioned above. Subsequently, at the point when the operable knob 12 is displaced by 2.5 mm from the neutral position, the rotation detection reaches the "CLOSED" state. However, since the slide detection is already in the "CLOSED" state, the rotation detection is invalidated and the angle counting section 113 maintains the current output state. When the operable knob 12 reaches a 3.5-mm position, which is an end position of a slidable range, from the neutral position, the sliding of the operable knob 12 is stopped.

In the complex-operation input device according to this embodiment, the output signals from each light receiver 2b and each light receiver 3b are analog signals with a voltage corresponding to a rate at which the corresponding first detected portion 7e and the second detected portion 9e respectively block the light receiver 2b and the light receiver 3b from the light emitter 2a and the light emitter 3a. On the other hand, the slide-signal output section 114 and the angle counting section 113 each include a binarization function and are configured to binarize the output signals from the light receiver 2b and the light receiver 3b to the "OPEN" or "CLOSED" state on the basis of a predetermined threshold value. Accordingly, by adjusting the threshold value in the binarization function included in each of the angle counting section 113 and the slide-signal output section 114, the slide detection can be performed at a more appropriate timing prior to the rotation detection. When the first detected portion 7e passes through between the light emitter 2a and the light receiver 2b or when the second detected portion 9e passes through between the light emitter 3a and the light receiver 3b, if the period in which the output signals from the light receiver 2b and the light receiver 3b changes from a minimum value to a maximum value is short, the output signals from the light receiver 2b and the light receiver 3b can be used as pseudo-binary signals.

The command processing section 115 having received the output signal from the slide-signal output section 114 switches the operation mode in accordance with the detected sliding direction, and updates "operation mode" information stored in the operation-state storage section 116 in step S1103, thereby ending the process.

On the other hand, if the angle counting section 113 detects rotating operation (YES in step S1104) before the slide-signal output section 114 recognizes sliding operation (NO in step S1101), the angle counting section 113 outputs a counted-rotational-angle signal to the command processing section 115, as mentioned above. As a result, the command processing section 115 acquires operation-state information from the operation-state storage section 116 in step S1105.

After acquiring the operation-state information, the command processing section 115 calculates an updated set value in step S1106 in accordance with the rotational angle received from the angle counting section 113. Then, the command processing section 115 outputs the updated set value to the operation-state storage section 116 and the device control section 117 in step S1107, thereby ending the process.

As described above, in the control system of the complex-operation input device according to this embodiment, each sensor and each non-sensor are arranged so that sliding operation is detected prior to detection of rotating operation, and when sliding operation is detected, rotating operation is disabled. Therefore, a design for preventing a change in rotation detection during sliding operation is not necessary. Consequently, in the complex-operation input device that allows for rotating operation and sliding operation, misdetection of rotating operation during sliding operation can be prevented, and the design load can be reduced.

In the complex-operation input device according to this embodiment, when the slide-signal output section 114 sends a slide signal to the angle counting section 113, the angle counting section 113 maintains the current output state instead of stopping its operation. Therefore, a malfunction of the input device can be prevented without adversely affecting subsequent signal processing.

As described as an example in the above embodiment with reference to FIG. 9, when the slide-signal output section 114 outputs a slide signal, the angle counting section 113 receives the slide signal and maintains the output state to the command processing section 115 so as to disable rotating operation. Alternatively, the disabling of rotating operation may be implemented in the command processing section 115. Specifically, in a case where the command processing section 115 acquires a slide signal from the slide-signal output section 114, even if the command processing section 115 subsequently acquires a rotational-angle signal from the angle counting section 113, the signal may be discarded as an ineffective signal. Even in that case, each component is arranged so that sliding operation is detected prior to detection of rotating operation so that similar advantages can be achieved.

The slide sensors 2 and the rotation sensors 3 may be non-contact sensors of other types, such as a magnetic detection type, instead of an optical detection type, or may be contact sensors that use wipers.

Furthermore, in the above-described complex-operation input device, the slider 6 (holder-slider unit 8) slides against the bias force of the first coil spring 15 during sliding operation, and when the sliding operation force is released, the slider 6 can be automatically returned to the original neutral position with the bias force of the first coil spring 15. Therefore, rotating-operation information at the neutral position can always be extracted, thereby reducing the possibility of misoperation.

Although the holder-slider unit 8 in which the slider 6 and the rotor holder 7 as separate components are connected to each other is used in the above embodiment, a holder-slider unit of a single-piece construction may be used as an alternative so as to reduce the number of components. Furthermore, if pressing operation is not necessary, the actuator 10 and the push switch 4 may be omitted.

Furthermore, although the description of the above embodiment is directed to an input device for performing various kinds of operation for a vehicle air conditioner, the present invention can be applied to various types of input devices that at least allow for rotating operation and sliding operation.

What is claimed is:

1. A complex-operation input device that allows for rotating operation and sliding operation in a direction substantially orthogonal to a central axis of rotation of the rotating operation, the device comprising:
    a first detecting portion and a second detecting portion that are mounted on a base;
    a slider holder fixed on the base;
    a holder-slider unit having a rotation guiding portion and a first detected portion, and slidably supported by the slide holder; and
    a rotor that has a second detected portion extending in a circumferential direction of a cylindrical surface surrounding the holder-slider unit, and that is rotatably supported by the holder-slider unit via the rotation guiding portion,
    wherein the first detecting portion and the slide holder are disposed within a circle obtained by projecting the cylindrical surface onto the base, and the second detecting portion is disposed on or near the circle, and
    wherein a change in slide position of the first detected portion in response to sliding of the rotor and the holder-slider unit is detected by the first detecting portion, and a change in rotational position of the second detected portion in response to rotation of the rotor is detected by the second detecting portion.

2. The complex-operation input device according to claim 1, wherein the first detecting portion and the second detecting portion are positioned apart from each other by about 90° around an intersecting point between the central axis of rotation of the rotor and the base.

3. The complex-operation input device according to claim 2, wherein the first detecting portion and the second detecting portion are both photo-interrupters.

4. The complex-operation input device according to claim 1, wherein the holder-slider unit slides against a bias force of a return spring during the sliding operation and is automatically returned to an original neutral position by the bias force of the return spring when a sliding operation force is released.

* * * * *